United States Patent
Chang et al.

(10) Patent No.: US 8,083,954 B2
(45) Date of Patent: Dec. 27, 2011

(54) METHOD FOR FABRICATING COMPONENT-EMBEDDED PRINTED CIRCUIT BOARD

(75) Inventors: Chien-Wei Chang, Taoyuan (TW); Ting-Hao Lin, Taipei (TW); Yu-Te Lu, Taoyuan (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 845 days.

(21) Appl. No.: 12/131,932

(22) Filed: Jun. 3, 2008

(65) Prior Publication Data
US 2009/0294052 A1 Dec. 3, 2009

(51) Int. Cl.
*H01B 13/00* (2006.01)
(52) U.S. Cl. .............. 216/13; 216/17; 216/36
(58) Field of Classification Search .......... None
See application file for complete search history.

(56) References Cited

U.S. PATENT DOCUMENTS

| | | |
|---|---|---|
| 5,079,069 A | 1/1992 | Howard et al. |
| 5,155,655 A | 10/1992 | Howard et al. |
| 5,161,086 A | 11/1992 | Howard et al. |
| 2006/0203456 A1* | 9/2006 | Sohn et al. ............ 361/748 |
| 2007/0062725 A1* | 3/2007 | Wu et al. ............... 174/260 |
| 2007/0275525 A1* | 11/2007 | Das et al. .............. 438/250 |

* cited by examiner

*Primary Examiner* — Shamim Ahmed (57) ABSTRACT

A method for fabricating a component-embedded PCB includes: providing a carrier plate having a plating metal layer plated thereon; disposing an electronic component on the plating metal layer of the carrier plate; laminating a metal layer onto the plating metal layer having the electronic component disposed thereon and the carrier plate by a dielectric film; removing the carrier plate and exposing the plating metal layer; and patterning at least one of the metal layer and the plating metal layer to be a circuit layer.

8 Claims, 10 Drawing Sheets

METHOD FOR FABRICATING COMPONENT-EMBEDDED PRINTED CIRCUIT BOARD

BACKGROUND OF THE INVENTION

1. Field of the Invention

The present invention relates generally to a method for fabricating a circuit board, and more particularly to a method for fabricating a printed circuit board having an embedded component.

2. The Prior Arts

Embedded passives are passive components disposed between layers of a multi-layer circuit board. The electronic components, such as capacitors or resistors are directly formed on an inner layer of the circuit board by etching or printing. Then, at least one outer layer of the circuit board is laminated onto the inner circuit board to bury the electronic component inside the multi-layer circuit board. The embedded passives are adapted to replace those discrete passives soldered to the circuit board, so as to free up space on the circuit board to pack more circuitry and active components.

Buried resistor technologies are first proposed by Ohmega Technologies, Inc., a manufacturer of OHMEGA-PLY® resistor-conductor material. The buried resistor is a thin film of a phosphorous-nickel alloy serving as a resistive element plated onto a matt side of a copper foil of an inner layer. Then, they are compressed to configure a thin core, and later processed by photo-resist processing twice and etching processing thrice, so as to configure a desired thin film resistor at a certain position. Such a thin film resistor is disposed between the layers, and thus called buried resistor.

In 1992, Zycon, a U.S. PCB manufacturer, proposed to further provide an extreme thin dielectric inner layer, e.g., 2 to 4 mils, in a high level multilayer circuit board in addition to original Vcc/GND inner layers. An integral capacitor is configured by the parallel copper layers of the circuit board, which provide a large area of the copper layer. Because the capacitor is disposed between the layers, it is named as buried capacitor (BC). The buried capacitor has advantages of avoiding noise, providing charging power, and stabilizing voltage, during operating at a basic frequency. With respect to the BC, Zycon owns several U.S. patents, i.e., U.S. Pat. No. 5,079,069, U.S. Pat. No. 5,161,086, and U.S. Pat. No. 5,155,655.

Recently, the concept of the embedded passives is applied to fabricate active components in the circuit board for increasing a packaging density. Accordingly, a recess is formed in an insulating layer, and an electronic component is embedded in the recess. However, the circuit board still has the insulating layer remained beneath the electronic component. Therefore, the overall thickness of the circuit board and density of the circuitry can be further improved.

SUMMARY OF THE INVENTION

A primary objective of the present invention is to provide a method for fabricating a component-embedded printed circuit board, which has no insulating layer remained beneath a component, thereby reducing a thickness of the PCB and increasing a density of circuitry.

In order to achieve the objective, a method for fabricating a component-embedded PCB according to the present invention includes: providing a carrier plate having a plating metal layer plated thereon; disposing an electronic component on the plating metal layer of the carrier plate; laminating a metal layer onto the plating metal layer and the carrier plate by a dielectric film; removing the carrier plate to expose the plating metal layer; and patterning at least one of the metal layer and the exposed plating metal layer to form a circuit layer.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

Figure 1A:
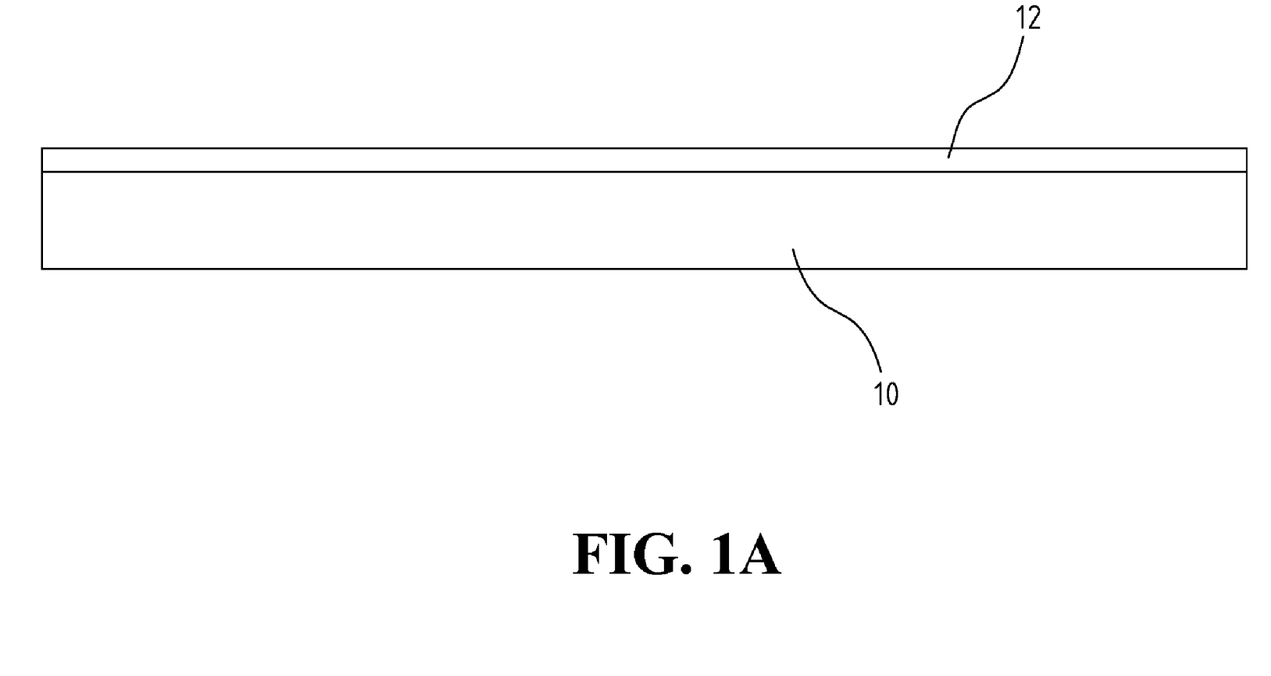
FIGS. 1A to 1H are schematic diagrams illustrating steps of a method for fabricating a component-embedded PCB according to a first embodiment of the present invention.

FIGS. 1A to 1H are schematic diagrams illustrating a method for fabricating a component-embedded PCB according to a first embodiment of the present invention. Referring to FIG. 1A, a carrier plate 10 having a plating metal layer 12 plated thereon is provided. The carrier plate 10 is made of a conductive material, and the plating metal layer 12 is made of copper.

Figure 1B:
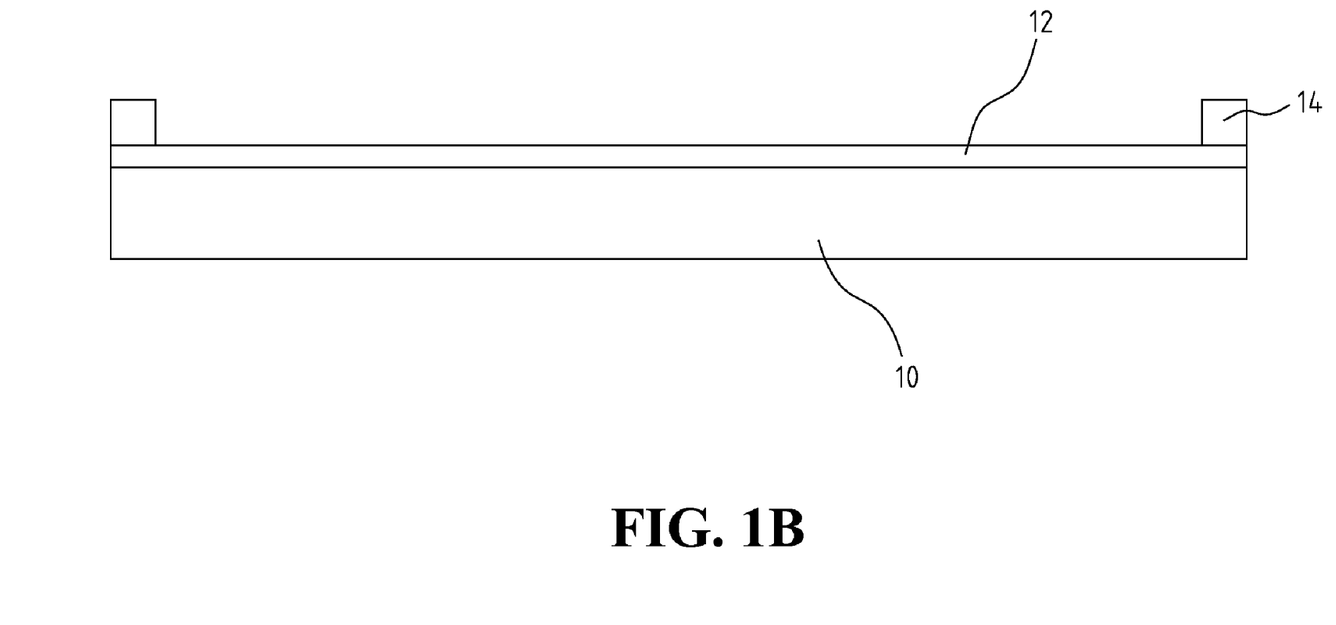
Figure 1C:
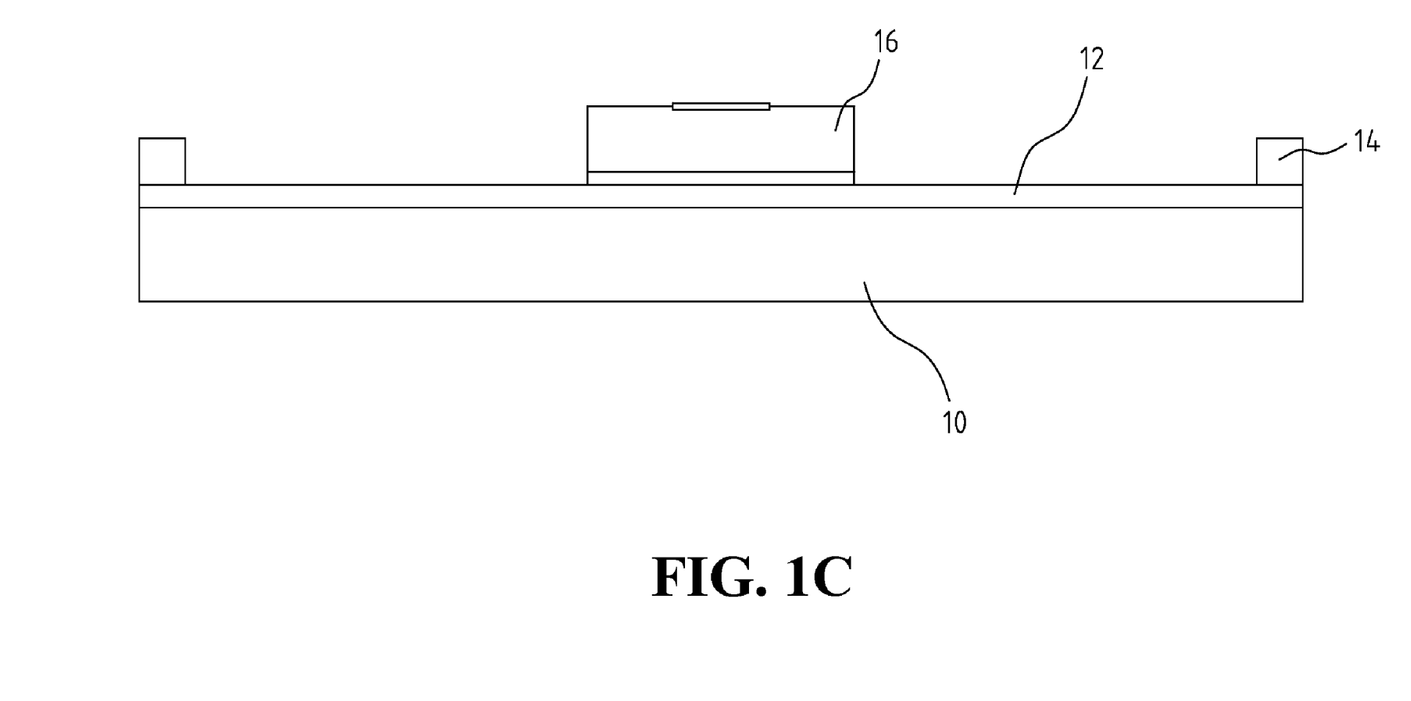
Figure 1D:
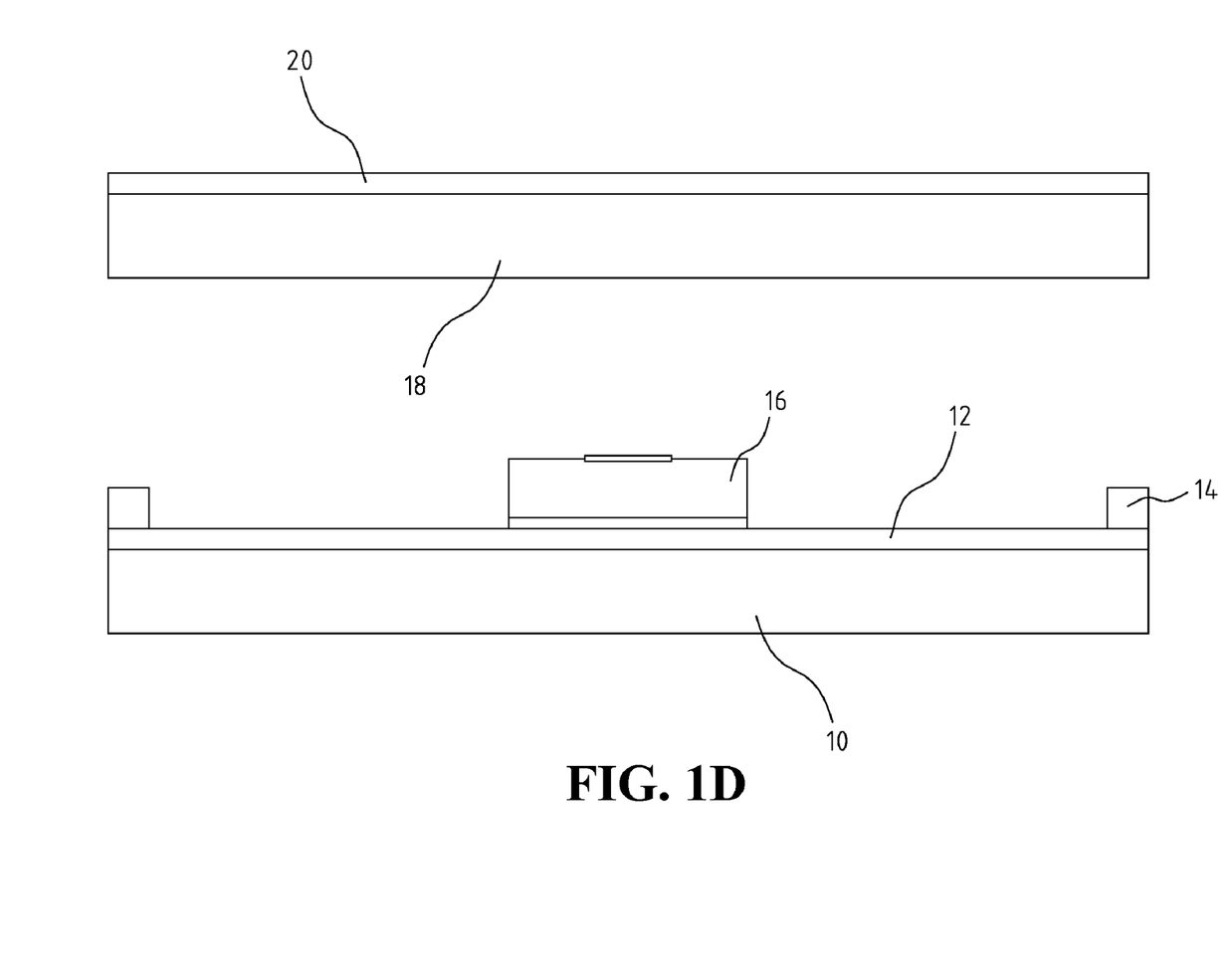
Figure 1E:
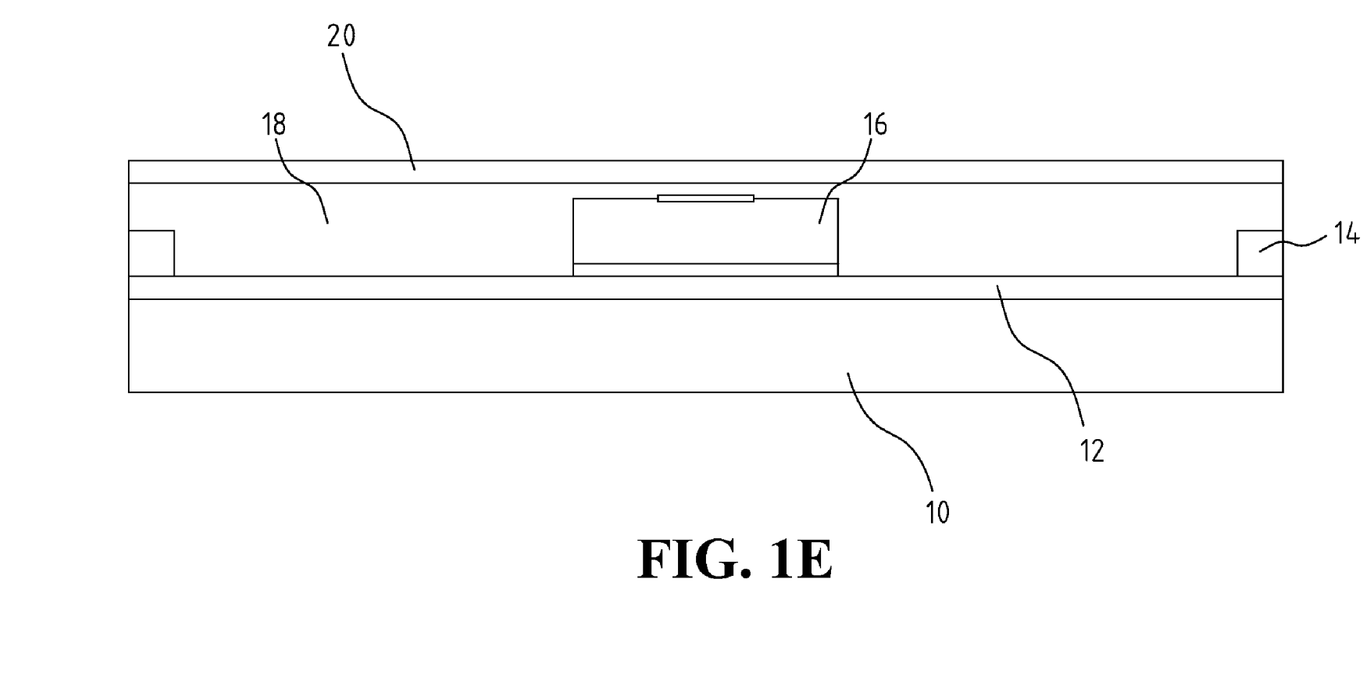
Figure 1F:
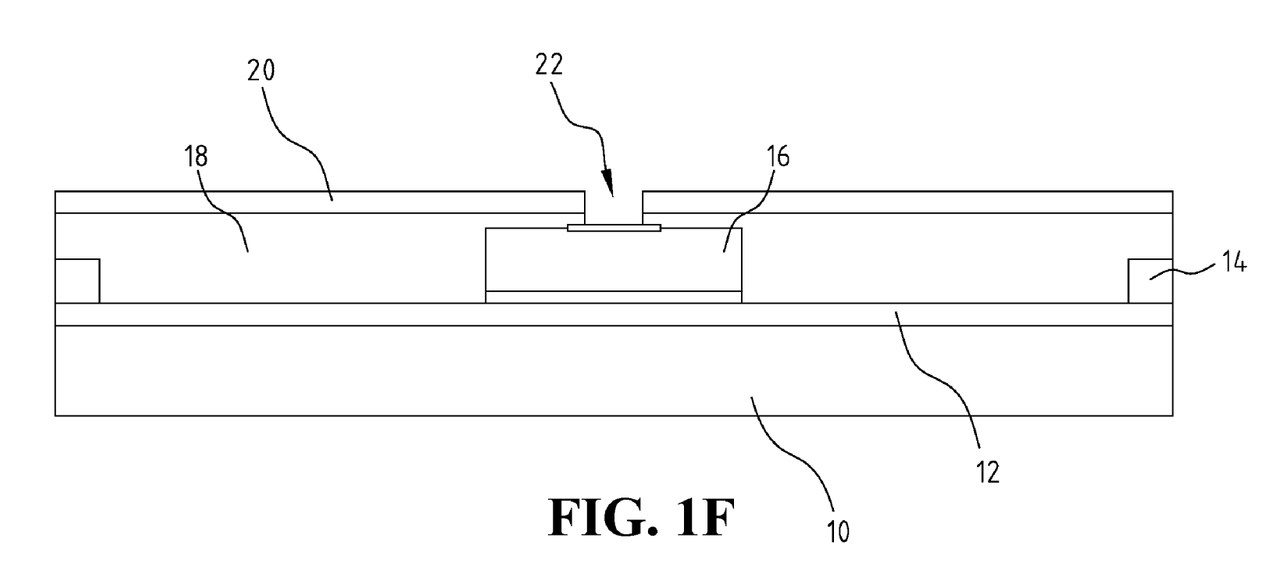
Figure 1G:
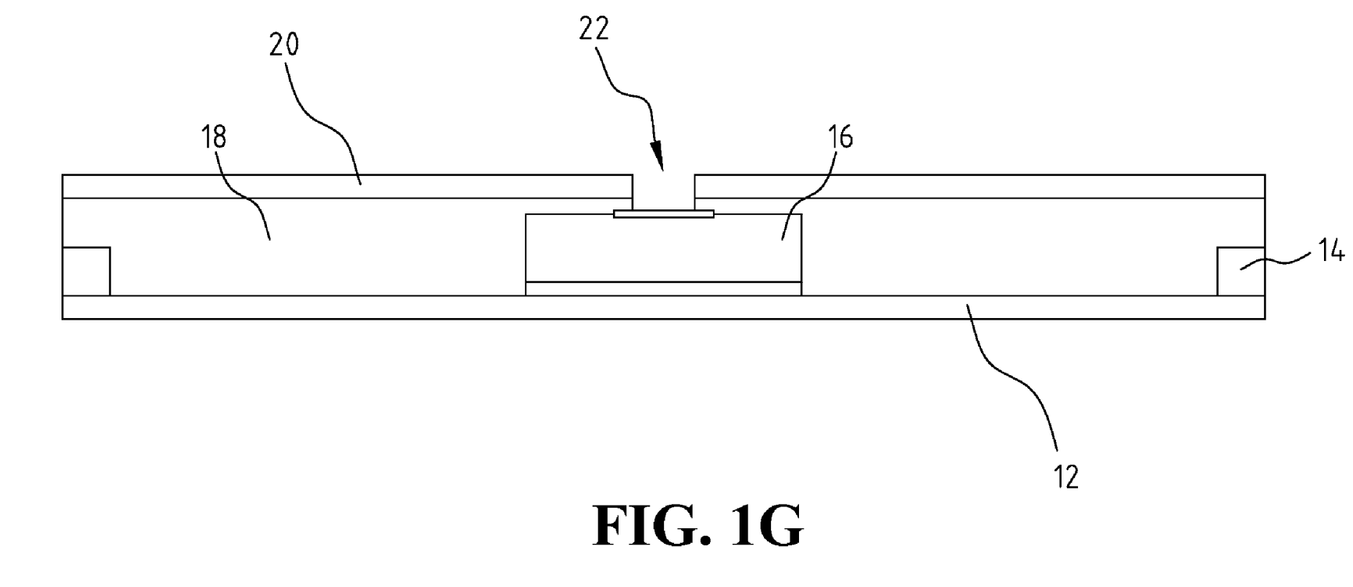
Figure 1H:
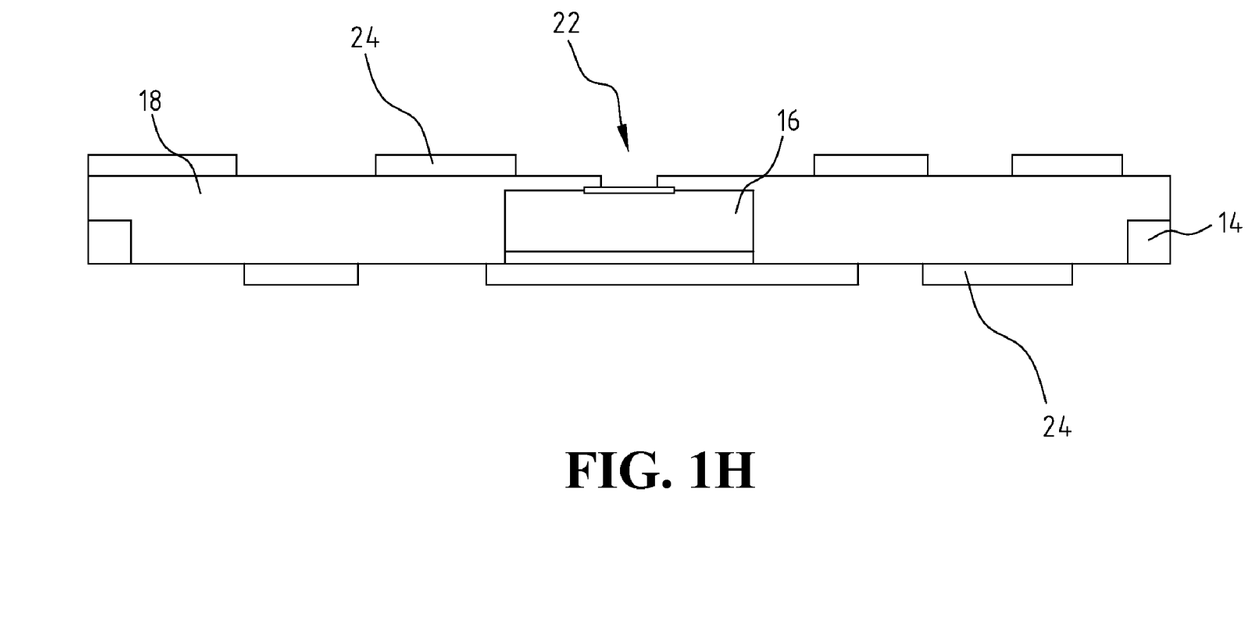

As shown in FIG. 1B, a plurality of surface mount technology (SMT) fiducial marks 14 are provided on the plating metal layer 12 for positioning purpose. Referring to FIG. 1C, an electronic component 16 is disposed on the plating metal layer 12 of the carrier plate 10. Referring to FIGS. 1D-1E, a metal layer 20 is laminated onto the plating metal layer 12 having the electronic component 16 disposed thereon and the carrier plate 10 by a dielectric film 18. As shown in FIG. 1F, an opening 22 corresponding to the electronic component 16 is formed for the convenience of later processing a through hole (not shown) for the electronic component 16 to output signals. The carrier plate 10 is then removed from the laminated metal layer 20, the dielectric film 18, the plating metal layer 12 and the carrier plate 10 to expose the plating metal layer 12 as shown in FIG. 1G. Then, patterning at least one of the metal layer 20 and the exposed plating metal layer 12 to form a circuit layer 24 as shown in FIG. 1H. Therefore, the component-embedded PCB only has the circuit layer 24 and does not have any insulating layer remained beneath the electronic component 16, thereby reducing a thickness of the component-embedded PCB. The component-embedded PCB fabricated by the method according to the present invention would have a higher density of circuitry than a conventional PCB does.

The electronic component 16 may be an active component or a passive component, such as a capacitor, a resistor, or an inductance. In order to enhance the bonding between the carrier plate 10 and the plating metal layer 12, the carrier plate 10 is configured with a rough surface.

In addition to the steps as shown in FIGS. 1D-1E, the metal layer 20 can be laminated onto the plating metal layer 12 having the electronic component 16 disposed thereon and the carrier plate 10 in another ways.

Figure 2A:
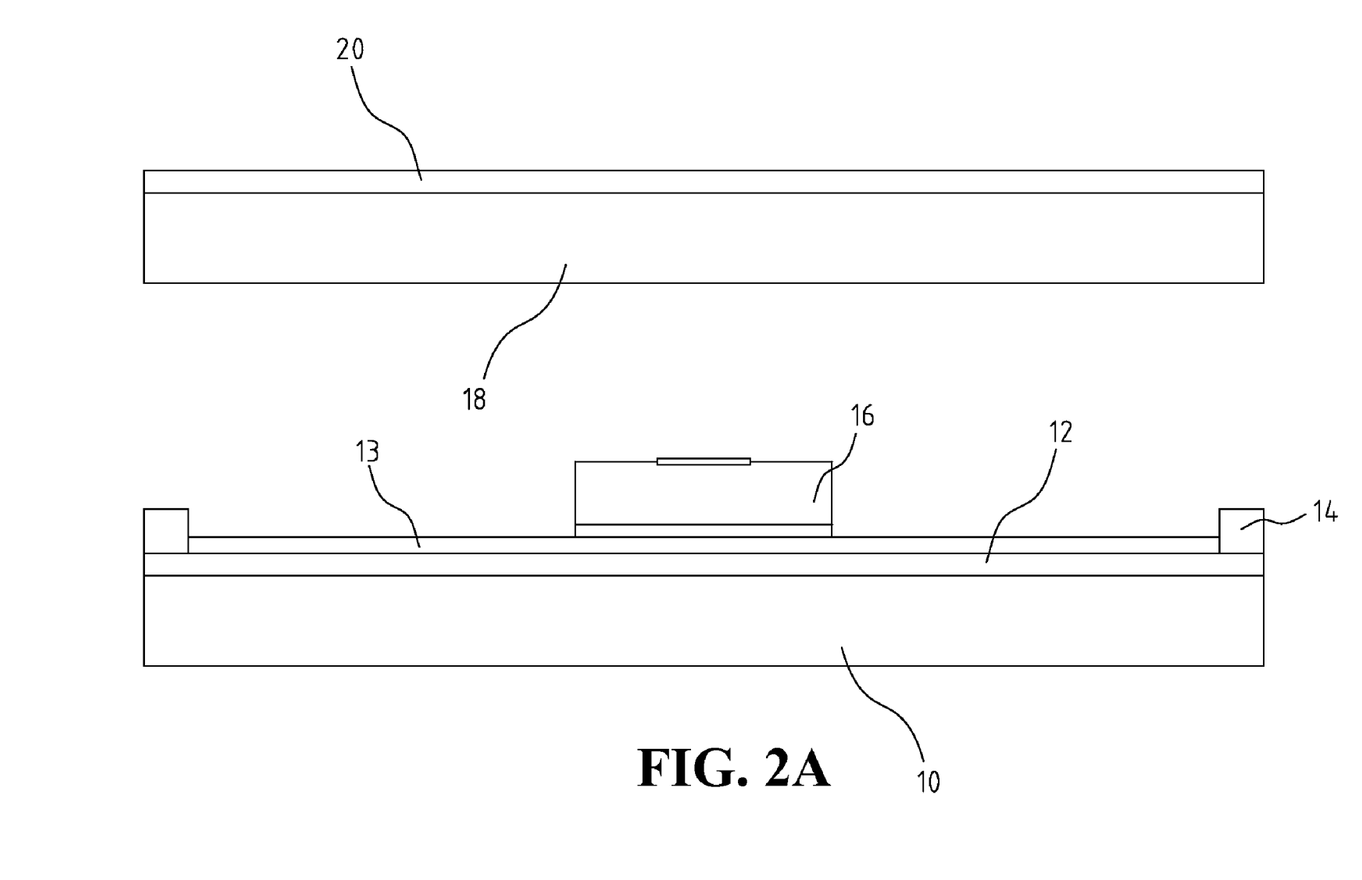
FIG. 2A is schematic diagrams illustrating a step of a method for fabricating a component-embedded PCB according to a second embodiment of the present invention.

Referring to FIG. 2A, a method for fabricating a component-embedded PCB according to a second embodiment of the present invention further provides a dielectric layer 13 disposed on the plating metal layer 12 to enhance the electrical insulation before disposing the electronic component 16 on the dielectric layer 13. Then, the metal layer 20 is laminated onto the dielectric layer 13 of the carrier plate 10 by the dielectric film 18 similar to FIGS. 1D-1E.

Figure 2B:
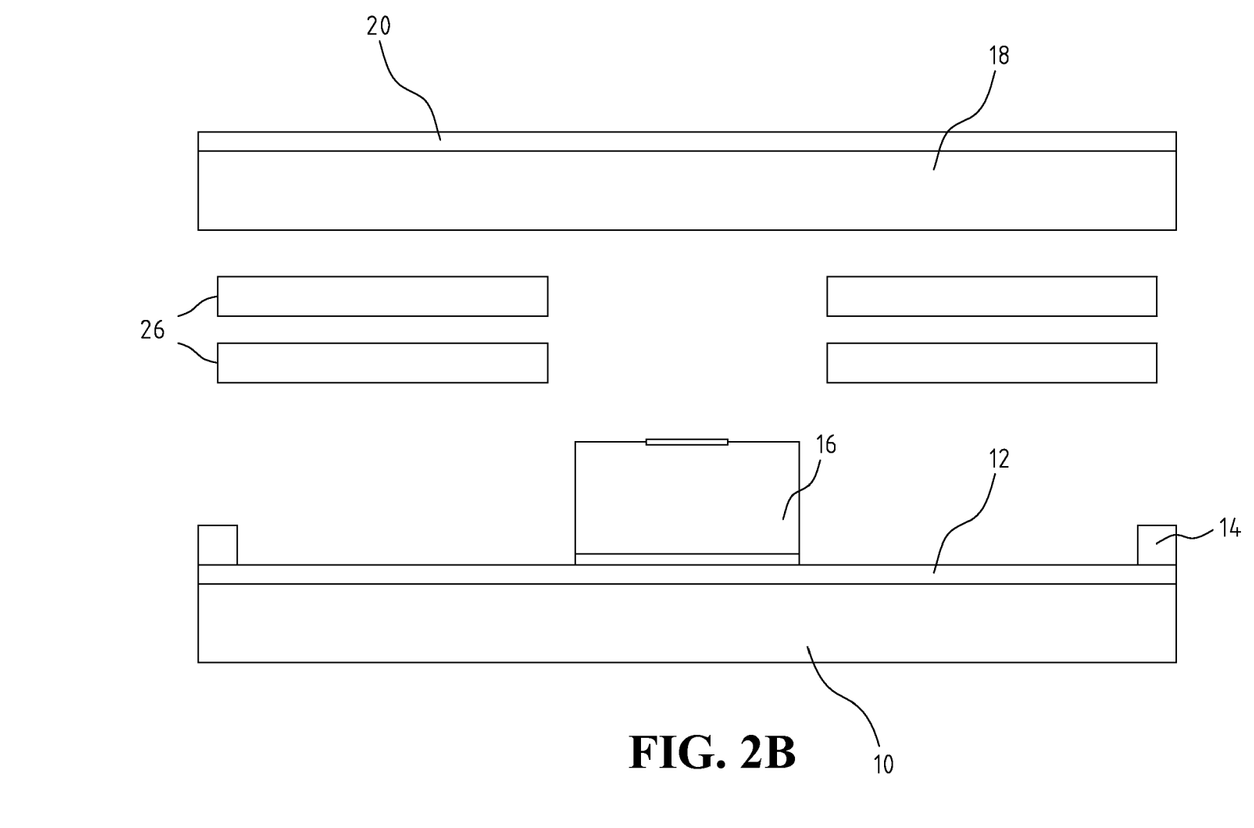
FIG. 2B is schematic diagrams illustrating a step of a method for fabricating a component-embedded PCB according to a third embodiment of the present invention.

If the electronic component 16 is too thick, the electronic component 16 is likely to be damaged during the metal layer 20 being laminated onto the carrier plate 10 and the plating metal layer 12 by the dielectric film 18. Referring to FIG. 2B, a method for fabricating a component-embedded PCB according to a third embodiment of the present invention further provides two dielectric sheets 26 to prevent the electronic component 16 from damage. Each of the dielectric sheets 26 includes a cavity corresponding to the electronic component 16 and is disposed around the electronic component 16. Then, the carrier plate 10 and the plating metal layer 12 having the electronic component 16 disposed thereon, the dielectric sheets 26, and the metal layer 20 having the dielectric film 18 are laminated together similar to FIGS. 1D-1E.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for fabricating a component-embedded PCB, comprising the steps of:
   providing a carrier plate having a plating metal layer plated thereon;
   disposing an electronic component directly on the plating metal layer;
   laminating a metal layer onto the plating metal layer and the electronic component by a dielectric film;
   removing the carrier plate and exposing the plating metal layer; and
   patterning at least one of the metal layer and the plating metal layer to form a circuit layer, wherein thickness of the component-embedded PCB is reduced by removing the carrier plate.

2. The method according to claim 1, wherein the electronic component is an active component.

3. The method according to claim 1, wherein the electronic component is a passive component selected from the group consisting of a capacitor, a resistor, and an inductance.

4. The method according to claim 1, wherein the carrier plate is made of a conductive material.

5. The method according to claim 1, wherein the carrier plate is configured with a rough surface for enhancing bonding between the plating metal layer and the carrier plate.

6. The method according to claim 1, further comprising the step of providing a dielectric layer between the plating metal layer and the electronic component.

7. The method according to claim 1, further comprising the step of providing at least one dielectric sheet having a cavity corresponding to the electronic component; wherein the dielectric sheet is disposed between the plating metal layer and the dielectric film, and the dielectric sheet is disposed around the electronic component.

8. The method according to claim 6, further comprising the step of providing at least one dielectric sheet having a cavity corresponding to the electronic component, wherein the dielectric sheet is disposed between the dielectric layer and the dielectric film, and the dielectric sheet is disposed around the electronic component.

\* \* \* \* \*